(12) United States Patent
Kim

(10) Patent No.: US 7,541,828 B2
(45) Date of Patent: Jun. 2, 2009

(54) BURN-IN SORTER AND SORTING METHOD USING THE SAME

(75) Inventor: Byoung Woo Kim, Seoul (KR)

(73) Assignee: Mirae Corporation, Chungcheongnam-do (KR)

( * ) Notice: Subject to any disclaimer, the term of this patent is extended or adjusted under 35 U.S.C. 154(b) by 34 days.

(21) Appl. No.: 11/808,730

(22) Filed: Jun. 12, 2007

(65) Prior Publication Data
US 2007/0296448 A1    Dec. 27, 2007

(30) Foreign Application Priority Data
Jun. 13, 2006    (KR) .................... 10-2006-0053183

(51) Int. Cl.
*G01R 31/26*    (2006.01)
(52) U.S. Cl. ............... 324/765; 324/760; 324/158.1
(58) Field of Classification Search ............... None
See application file for complete search history.

(56) References Cited

U.S. PATENT DOCUMENTS

| | | | |
|---|---|---|---|
| 3,969,229 A | 7/1976 | Horner | |
| 6,209,194 B1 | 4/2001 | Kang | |
| 6,239,396 B1 | 5/2001 | Kang | |
| 6,323,669 B1 * | 11/2001 | Kang | 324/765 |
| 6,563,331 B1 | 5/2003 | Maeng | |
| 6,882,141 B2 * | 4/2005 | Kim | 324/158.1 |
| 2005/0062463 A1 | 3/2005 | Kim | |

* cited by examiner

*Primary Examiner*—Minh N Tang
(74) *Attorney, Agent, or Firm*—Ked & Associates LLP

(57) ABSTRACT

Provided is an apparatus for sorting burn-in tested packaged chips, including a DC test unit performing a DC test on packaged chips, a DC failure/loading head moving in a first direction to load packaged chips onto the DC test unit, and an inserting head moving in a second direction perpendicular to the first direction to transfer DC test-passed packaged chips from the DC test unit to a burn-in board, wherein the DC test unit is moved in the second direction, close to the DC failure/loading head when loading the packaged chips onto the DC test unit and close to the inserting head when transferring the packaged chips to the burn-in board, to sort burn-in tested packaged chips. The structure in which the DC test unit is movable toward the DC failure/loading head and the inserting head makes it possible to reduce the distance which the heads have to travel and to prevent the DC failure/loading head and the inserting head from interfering with each other.

11 Claims, 7 Drawing Sheets

BURN-IN SORTER AND SORTING METHOD USING THE SAME

CROSS-REFERENCE TO RELATED APPLICATION

This application claims the benefit of Korean Patent Application No. 10-2006-0053183 filed on Jun. 13, 2006, in the Korean Intellectual Property Office, the disclosure of which is incorporated herein by reference.

BACKGROUND OF THE INVENTION

1. Field of the Invention

The present invention relates to an apparatus and method for sorting burn-in tested packaged chips, and more particularly to an apparatus and method for sorting burn-in tested packaged chips, with a DC test unit and an unloading buffer movable to heads.

2. Description of the Background Art

At the conclusion of a packaging process, packaged chips are put through a series of environmental, electrical, and reliability tests. These tests vary in type and specifications, depending on the customer and use of the packaged chips. The tests may be performed on all of the packaged chips in a lot or on selected samples. The environmental test such as temperature cycling is performed to weed out leaking and defective packages. The packaged chips are loaded into a chamber and cycled between two temperature extremes. The electrical test includes a series of parametric test checking the general performance of the packaged chips, and a functional test exercising the specific chips functioning. An apparatus for sorting burn-in tested chips performs the DC characteristic test on the packaged chips which are intended for burn-in test, and sorts burn-in tested packaged chips on a basis of grade assigned according to a result of burn-in test.

The packaged chips are moved by a head, in the apparatus for sorting packaged chips. Pickers, provided to the head, picks up and release the packaged chips.

FIG. 1 is a plane view illustrating a schematic configuration of a conventional apparatus for sorting burn-in tested packaged chips, which was disclosed in the Korean laid-open publication No 2000-65749.

As shown in FIG. 1, a loading unit 3, where a tray containing packaged chips stays, is provided on one side region of a main body 1 of the apparatus for sorting burn-in tested packaged chips. An unloading unit 4, where a tray stays to contain burn-in test-passed packaged chips, is provided on the opposite side region of the main body 1.

A sorting unit 5, where trays stay to contain burn-in test-failed packaged chips according to their grades, is provided in the front between the loading unit 3 and the unloading unit 4. A rack 2, from which a burn-in board containing burn-in tested packaged chips is supplied, is provided beside the main body 1. A table 20 is provided inside the main body 1. The table 20 takes out the burn-in board 'B' from the rack 2 and brings it inside the main body 1. The table 20 returns the burn-in board 'B' to the rack 2. A DC test unit 8 is provided adjacent to the loading unit 3. An unloading buffer 10 is provided adjacent to the unloading unit 4.

A main X-axis frame 6 is provided on the main body 1, crossing over the DC test unit 8, the burn-in board 'B', and the unloading buffer 10. A loading head 11, an inserting head 12, a removing head 13, and an unloading head 14 are provided on the main X-axis frame 6. The loading head 11 transfers the packaged chips from the loading unit 3 to the DC test unit 8. The inserting head 12 transfers the packaged chips from the DC test unit 8 to the burn-in board 'B'. The removing head 13 transfers the packaged chips from the burn-in board 'B' to the unloading buffer 10. The unloading head 14 transfers the packaged chips from the unloading buffer 10 to the unloading unit 4.

A sorting head 15, which transfers burn-in test-failed packaged chips staying on the DC test unit 8 and the unloading buffer 10 to the sorting unit 5 along an X-Y axis 7, is provided over the sorting unit 5. A tray-transferring unit 18 is movably provided on an X-axis frame 19 which is positioned in the rear of the loading unit 3 and the unloading unit 4. The tray transferring unit 18, which transfers an empty tray from the loading unit 3 to the unloading unit 4 along the X-axis frame 19, is provided in the rear of the loading unit 3 and the unloading unit 4.

Operation of the apparatus for sorting burn-in tested packaged chips is now described.

When the apparatus for sorting burn-in tested packaged chips operates, a hook (not shown), provided to the table 20, pulls out one burn-in board 'B from the rack 2 and transfers it to a working area, located at the center of the main body 1. Subsequently, the tray is transferred in the rear from the loading unit 3, to be positioned under the main X-axis 6. The loading head 11 picks up the packaged chips from the loading unit 3 to transfer it to the DC test unit 8. The DC test unit 8 performs a DC test on the packaged chips. The inserting head 12 and the removing head 13 are simultaneously moved over the DC test unit 8 and the burn-in board 'B', respectively, after finishing the DC test. The inserting head 12 picks up the DC tested packaged chips from the DC test unit 8, and the removing head 13 picks up the burn-in tested packaged chips from the burn-in board 'B'.

Thereafter, the inserting head 12 and the removing head 13 are moved on the left to put the DC tested packaged chips and the burn-in tested packaged chips on the burn-in board 'B' and the unloading buffer 10, respectively. Subsequently, the inserting head 12 and the removing head 13 are moved back to be positioned over the DC test unit 8 and the burn-in board, respectively. Thereafter, the burn-in test-passed packaged chips on the unloading buffer 10 are loaded onto the tray 'T' staying at the unloading unit 4. The sorting head 15 is moved along the X-Y frame 7 toward the unloading buffer 10 to load the burn-in test-failed packaged chips placed on the unloading buffer 10 onto the tray 'T' in the sorting unit 5.

The burn-in board 'B' staying on the table 20 returns to its original position, after the burn-in tested packaged chips are removed from the burn-in board 'B' and new DC tested packaged chips are then inserted into the burn-in board 'B'.

However, the DC test unit 8 is fixed to the main body 1 of the conventional apparatus for sorting burn-in tested packaged chips. So, the inserting head is required to wait to pick up DC test-passed packaged chips from the DC test, until the loading head releases packaged chips intended for DC test on the DC test unit and then goes away from the DC test unit. This increases the time for preparing for DC test.

BRIEF DESCRIPTION OF THE INVENTION

Therefore, an object of the present invention is to reduce a distance which a DC failure/loading head has to travel, by moving a DC test unit toward the DC failure/loading head.

Another object of the present invention is to reduce a distance which an inserting head has to travel, by moving the DC test unit toward the inserting head, and to prevent the path for moving the inserting head from overlapping with the path for moving the loading unit.

According to an aspect of the present invention, there is provided an apparatus for sorting burn-in tested packaged chips, including a DC test unit performing a DC test on packaged chips, a moving unit moving the DC test unit, a DC failure/loading head moving in a first direction to load packaged chips onto the DC test unit, and an inserting head moving in a second direction perpendicular to the first direction to transfer the DC test-passed packaged chips from the DC test unit to a burn-in board.

The DC test unit may be moved in the second direction, close to the DC failure/loading head when loading the packaged chips onto the DC test unit, i.e., when transferring and placing the packaged chips intended for DC test to and on the DC test unit. Also, the DC test unit may be moved in the second direction, close to the inserting head when transferring the packaged chips to the burn-in board.

The apparatus for sorting burn-in tested packaged chips further includes a tray loader supplying packaged chips to the DC test unit, a tray unloader, provided opposite to the tray loader, withdrawing burn-in test-passed packaged chips, and a sorting unit receiving burn-in test-failed packaged chips.

The DC failure/loading head is moved between the tray loader and the DC test unit or the sorting unit.

The apparatus for sorting burn-in tested packaged chips further includes an unloading buffer, provided opposite to the DC test unit, receiving the packaged chips from the burn-in board. The apparatus for sorting burn-in tested packaged chips may further include a removing head moving in the second direction to transfer the burn-in tested packaged chips to the unloading buffer, and an unloading/sorting head moving in the first direction to transfer graded burn-in test-failed packaged chips to the tray unloader or the sorting unit after sorting the burn-in tested packaged chips transferred to the unloading buffer on a grade basis.

The unloading buffer is moved close to the removing head at a time of unloading packaged chips from the burn-in board onto the unlading buffer, and close to the unloading/sorting head at a time of grading burn-in tested packaged chips.

Two or more pickers are arranged in a row on the DC failure/loading head and the unloading/sorting head, in the direction in which the DC failure/loading head and the unloading/sorting head are moved.

Two or more pickers are arranged in a row on the inserting head and the removing head, in the direction perpendicular to a direction in which the inserting head and the removing head are moved. The inserting head and the removing head are formed as one body, thus enabling them to be moved at the same speed in the same direction.

The inserting head and the removing head are formed opposite to each other, and moved in the second direction between two frames which are arranged in a pair in the second direction.

The apparatus for sorting burn-in tested packaged chips may include a rejecting head transferring the DC test-failed packaged chips in the first direction, in addition to the DC failure/loading head.

The DC test-failed packaged chips on the DC test unit may be transferred to the burn-in board, without being singled out. Thereafter, the removing head transfers the DC test-failed packaged chips to a tray intended to contain burn-in test-passed packaged chips, through the unloading buffer. Later, the DC test-failed packaged chips may be all removed by the removing head, at a time.

The method for sorting burn-in tested packaged chips is now described.

A burn-in board containing burn-in tested packaged chips is mounted on a board table. The tray containing the packaged chips intended for burn-in test is provided to the tray loader, and the empty tray is provided to the tray unloader. A DC failure/loading head transfers packaged chips intended for DC test from the tray loader to a DC test unit. The DC test unit performs the DC test on the packaged chips intended for DC test. DC test-failed packaged chips are transferred by the DC failure/loading head to a specific tray. The DC test unit is moved close to the inserting head to pick up packaged chips intended for DC test and the unloading buffer is moved close to the removing head to pick up burn-in tested packaged chips. The inserting head and the removing head pick DC test-passed packaged chips and burn-in tested packaged chips, respectively. The removing head transfers the burn-in tested packaged chips to the unloading buffer. At the same time, the inserting head transfers and inserts the DC-tested packaged chips to and into the burn-in board. The unloading/sorting head transfers the burn-in test-passed packaged chips selected from the burn-in tested packaged chips on the unloading buffer to the tray unloader. Also, the unloading/sorting head transfers the burn-in test-failed packaged chips to the sorting unit. The burn-in board, when filled with packaged chips intended for the burin-in test, returns to the board unloader, and another burn-in board filled with new DC tested packaged chips is supplied from the board loader.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a plane view illustrating a schematic configuration of a conventional apparatus for sorting burn-in tested packaged chips;

DETAILED DESCRIPTION OF THE INVENTION

Reference will now be made in detail to the preferred embodiments of the present invention, examples of which are illustrated in the accompanying drawings.

Figure 1:
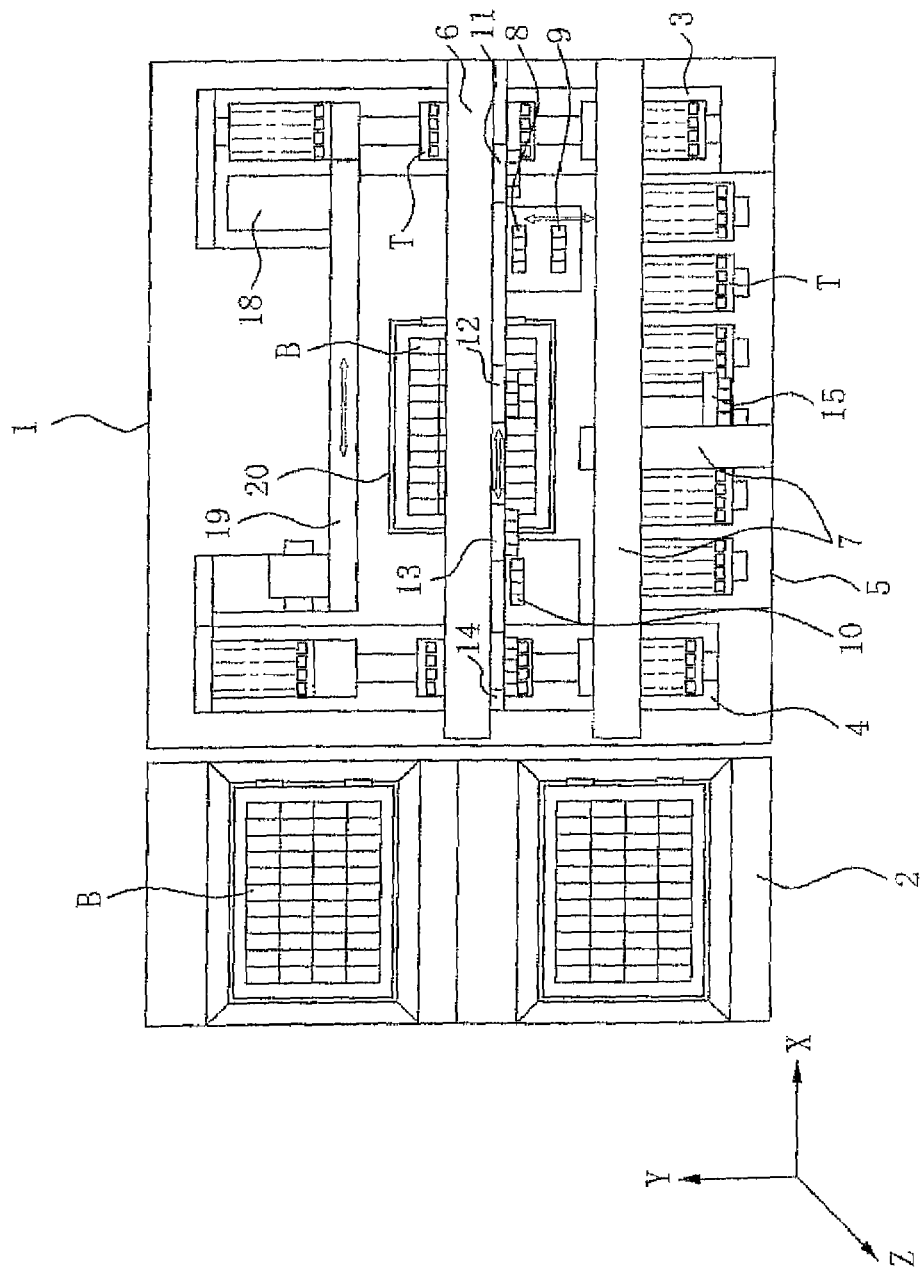
FIG. 1 is
Figure 2:
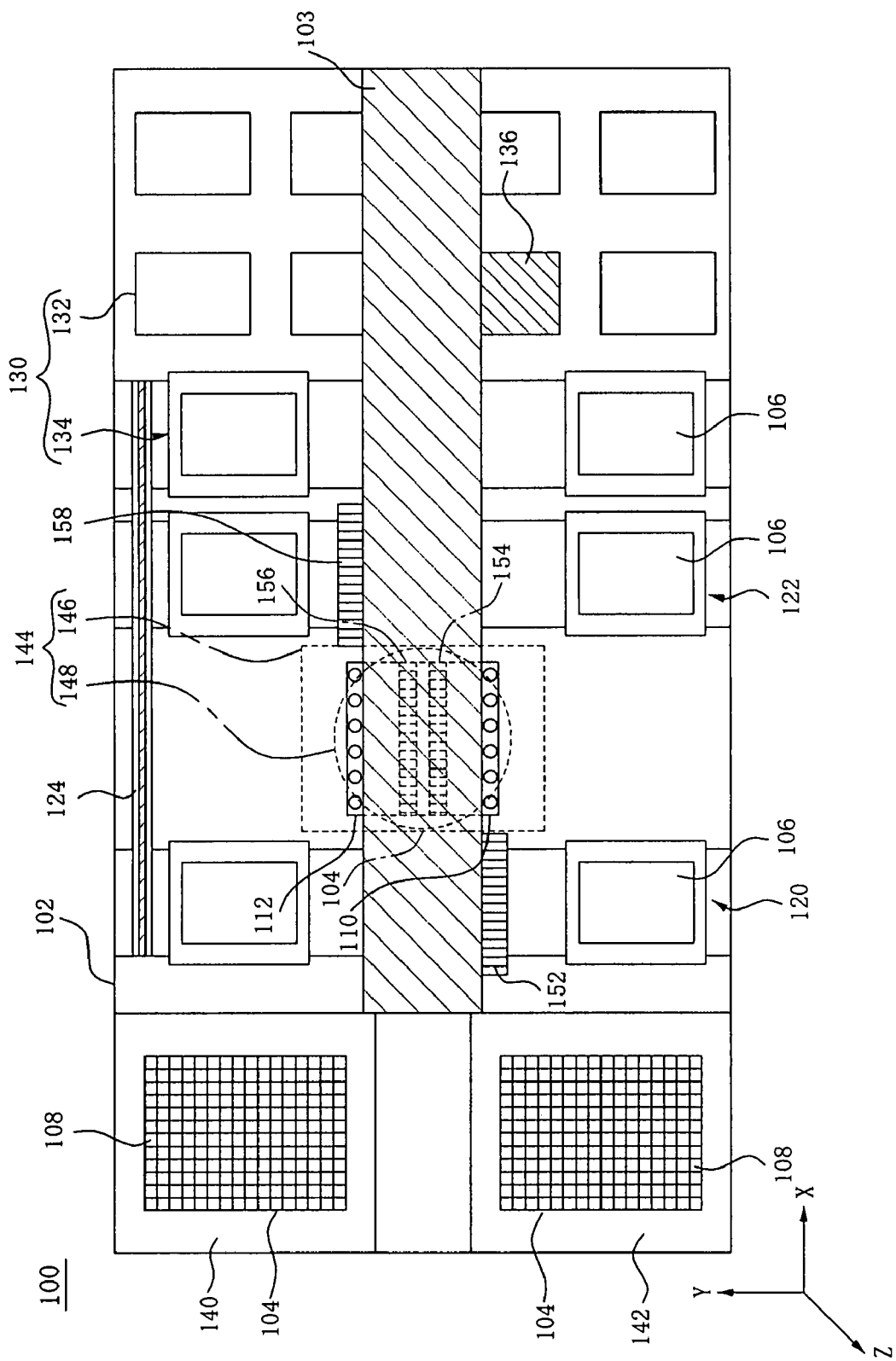
FIG. 2 is a plane view illustrating a schematic configuration of the apparatus for sorting burn-in tested packaged chips according to the present invention.

FIG. 2 a plane view illustrating a schematic configuration of the apparatus for sorting burn-in tested packaged chips according to the present invention.

The apparatus 100 for sorting burn-in tested packaged chips includes a main body 102, a board loader 140 supplying a burn-in board 104, and a board unloader 142 withdrawing a burn-in board 104.

The apparatus 100 for sorting burn-in tested packaged chips includes a tray loader 120 supplying packaged chips intended for DC test and a tray unloader 122 withdrawing burn-in test-passed packaged chips.

The apparatus 100 for sorting burn-in tested packaged chips includes a DC test unit 110 receiving packaged chips intended for DC test, an unloading buffer 112 receiving burn-in tested packaged chips, and a sorting unit 130 receiving burn-in test-failed packaged chips on a grade basis.

The apparatus 100 for sorting burn-in tested packaged chips includes a DC failure/loading head 152 transferring burn-in test-failed packaged chips to the DC test unit 110 and transferring packaged chips from the DC test unit 110 to the sorting unit 130.

The apparatus 100 for sorting burn-in tested packaged chips includes an inserting head 154 transferring DC tested packaged chips between the DC test unit 110 and the burn-in board 104 and a removing head 156 transferring burn-in tested packaged chips between the burn-in board 104 and the unloading buffer 112.

Burn-in tested packaged chips on the unloading buffer 112 are transferred by the unloading/sorting head 158. The burn-in test-passed packaged chips are transferred by the unloading/sorting head 158 to the tray unloader 122 and burn-in test-failed packaged chips are transferred to the sorting unit 130.

The inserting head 154 and the removing head 156 are moved in the same direction perpendicular to a direction in which the DC failure/loading head 152 is moved backwards and forwards. The unloading/sorting head 158 is moved in the same direction as the DC failure/loading head 152.

The main body 102 includes a first frame 103. A second frame (not shown) is provided below the first frame 103, in the direction perpendicular to a direction in which the first frame 103 is provided. A pair of second frames may be provided in the 'Y' direction with a burn-in board moving area between two second frames. A linear moving unit, such as a belt, a screw, an LM guide, or a rack, is provided to the second frame. The linear moving unit moves the inserting head and the removing head in the 'Y' direction.

A board table 144, on which the burn-in board 104 is mounted, is provided inside the main body 102. The burn-in board 104 has rows of sockets 108 into which packaged chips are inserted.

The board table 144 moves the burn-in board 104 mounted thereon in the 'X' and 'Y' directions. The board table 144 is moved by a linear moving unit 146, such as a belt, a screw, an LM guide, or a rack, which is provided below the board table 144. A rotating unit 148 equipped with a rotating motor (not shown) may be provided to rotate the burn-in board 104.

A board loader 140, which supplies the burn-in board 104 to the board table 144, is provided on one side region of the main body 102. A board unloader 142 is provided which withdraws the burn-in board 104 from the board table 144.

The DC test and the burn-in test are performed on the packaged chips inserted into the sockets 108 of the burn-in board 104 which is supplied by the board loader 140.

Once all of the test sockets 108 have been used, the board unloader 142 withdraws the burn-in board from the board table 144.

A linear moving unit, such as such as a belt, a screw, an LM guide, or a rack, may be provided to continuously move the board loader 140 and the board unloader 142.

The DC test unit 110 and an unloading buffer 112 are provided in the Y-axis direction, with the board table 144 in between. The DC test unit 110 and the unloading buffer 112 receive packaged chips arranged in a row in the X-axis direction.

The DC test unit 110 receives packaged chips and performs the DC test on the received packaged chips. A moving unit (not shown), provided below the DC test unit 110, moves the DC test unit 110 toward the inserting head 154, i.e., in the Y-axis direction. The DC test unit 110 is moved as far as the inserting head 154 is moved along the second frame (not shown).

The unloading buffer 112 receives burn-in tested packaged chips from the burn-in board 104. The unloading buffer 112 is moved toward the removing head 156 by a moving unit which is provided below the unloading buffer 112. The unloading buffer 112 is moved as far as the removing head 156 is moved along the second frame (not shown).

The tray loader 120 and the tray unloader 122 are provided in the direction in which the DC test unit 110 and the unloading buffer 112 are arranged, with the board table 144 in between. The tray loader 120, provided adjacent to one side of the board table 144, supplies a tray 106 containing packaged chips intended for DC test. The tray unloader 122, provided opposite to the tray loader 120 with the board table 144 in between, supplies an empty tray 106 to contain burn-in test-passed packaged chips.

A tray transferring unit 124 may be provided between the tray loader 120 and the tray unloader 122, to continuously supply an empty tray from the tray loader 120 to the tray unloader 122. The tray transferring unit 124 supplies from the tray loader 120 to the tray unloader 122 an empty tray 106 to contain burn-in test-passed packaged chips.

A linear moving unit, such as a belt, a screw, an LM guide, or a rack, may be provided to the tray loader 120, the tray unloader 122, and the tray transferring unit 124, to continuously supply a tray 106 to contain packaged chips intended for DC test and the empty tray 106 to contain burn-in test-passed packaged chips.

A sorting unit 130 is provided adjacent to one side of the tray unloader 122. The sorting unit 130 includes a sorting loader 134 continuously supplying an empty tray and at least one or more sorting trays 132. The sorting loader 134 and the sorting trays 132 receive burn-in test-failed packaged chips on a basis of grade assigned according to a result of grading burn-in test-failed packaged chips. The sorting loader 134 is assigned to the largest amount of burn-in test-failed packaged chips in the same grade. The empty tray 106 is continuously supplied to the sorting loader 134 from the tray loader 120 through the tray transferring unit 124. The sorting unit 130 includes at least one or more DC failure tray 136 to contain DC test-failed packaged chips.

A linear moving unit, such as a belt, a screw, an LM guide, or a rack, is provided to the sorting unit 130 to move the sorting loader 134, the sorting trays 132, the DC failure tray 136 in the Y-axis direction.

An inserting head 154 and a removing head 156, which are moved over the board table 144, are provided on the main body 102. The inserting head 154 and the removing head 156, which are moved in the Y-axis direction, are provided on the second frame (not shown). Two or more pickers, which pick up packaged chips, are provided on the inserting head 154 and the removing head 156. The pickers are arranged in a row in the direction perpendicular to the direction in which the inserting head 154 and the removing head 156 are moved backwards and forwards. That is, pickers are arranged on the inserting head 154 and the removing head 156, in a row in the X-axis direction.

The inserting head 154 and the removing head 156 are combined to be moved between the DC test unit 110 and the unloading buffer 112, at the same speed in the same direction.

The inserting head 154 is moved between the DC test unit 110 and the burn-in board 104. The removing head 156 is moved between the burn-in board 104 and the unloading buffer 112. The removing head 156 picks up burn-in tested packaged chips from the burn-in board 104 to transfer them to the unloading buffer 112. The inserting head 154 picks up DC test-passed packaged chips to transfer them to the burn-in board 104.

A DC failure/loading head 152 is provided on the first frame. Two or more pickers are arranged in a row on the DC failure/loading head 152, in the direction in which the DC failure/loading head 152 is moved, i.e., in the X-axis direction. The DC failure/loading head 152 is moved between the tray loader 120 and the DC test unit 110 and between the DC test unit 110 and the DC failure tray 136. The DC failure/loading head 152 picks up packaged chips from the tray transferring unit 124 to transfer them to the DC test unit 110. Also, the DC failure/loading head 152 transfers DC test-failed packaged chips to the DC failure tray 136. The DC failure tray 136 receives the DC test-failed packaged chips which are transferred to the sorting unit 130.

The unloading/sorting head 158, which is moved between the unloading buffer 112 and the tray unloader 122, is provided on the first frame 103, Pickers are arranged in a row on the unloading/sorting head 158, in the direction in which the unloading/sorting head is moved, i.e., in the X-axis direction. The unloading/sorting head 158 transfers burn-in test-passed packaged chips from the unloading buffer 112 to the tray unloader 122.

The burn-in test-failed packaged chips, not the burn-in test-passed packaged chips, are transferred to the sorting unit 130. The burn-in test-failed packaged chips are sorted for grade and contained in the sorting loader 134 or the sorting trays 132 according to a result of sorting the burn-in test-failed packaged chips.

Figure 3:
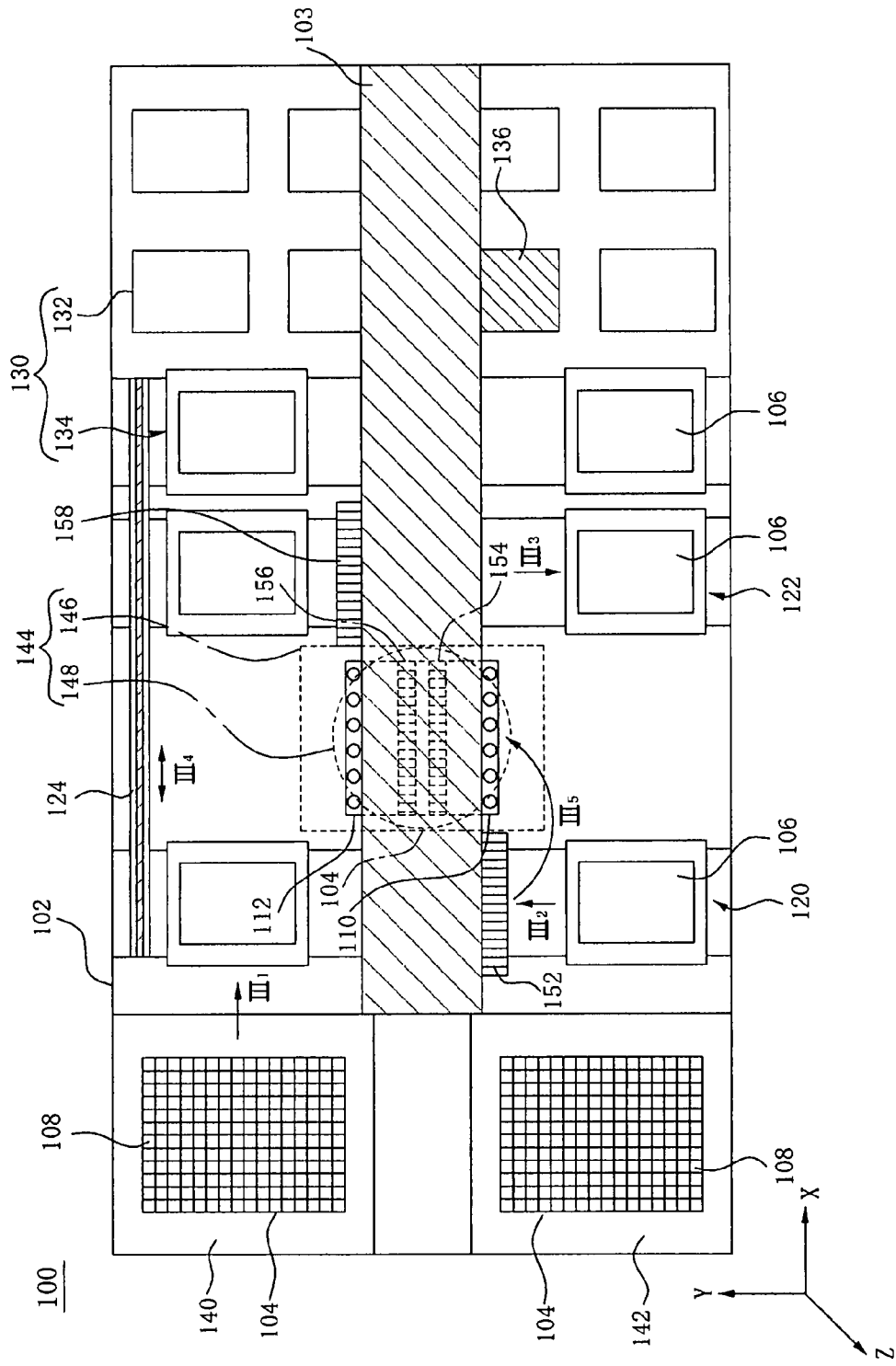
FIG. 3 is a plane view illustrating a schematic configuration of the apparatus for sorting burn-in tested packaged chips according to the present invention, which is necessary to describe step of preparing for DC test.

FIG. 3 is a plane view illustrating a schematic configuration of the apparatus for sorting burn-in tested packaged chips according to the present invention, which is necessary to describe steps of preparing for DC test As shown in FIG. 3, a board loader 140 is moved in the direction indicated by the arrow III 1 to supply the burn-in board 104 to the board table 144. A board unloader 142 transfers the used burn-in board 104 in the opposite direction of the arrow III 1 to withdraw the used burn-in board 104. The tray 106 is moved in the direction indicated by the arrow III 2 from the tray loader 120, to supply packaged chips intended for DC test to the DC failure/loading head 152. The tray unloader 122 moves the tray to contain the burn-in test-passed packaged chips, in the direction indicated by the arrow III 3. The tray transferring unit 124 is moved backwards and forwards in the direction of the arrow III 4 to continuously supply empty trays to the tray unloader 122. The DC failure/loading head 152 is moved in the direction of the arrow III 5 to transfer to the DC test unit 110 the packaged chips supplied from the tray loader 120. The DC failure/loading head 152 is moved backwards in the opposite direction to return to its original position, after transferring the packaged chips to the DC test unit 110. The DC test unit 110 performs the DC test on the received packaged chips.

Figure 4:
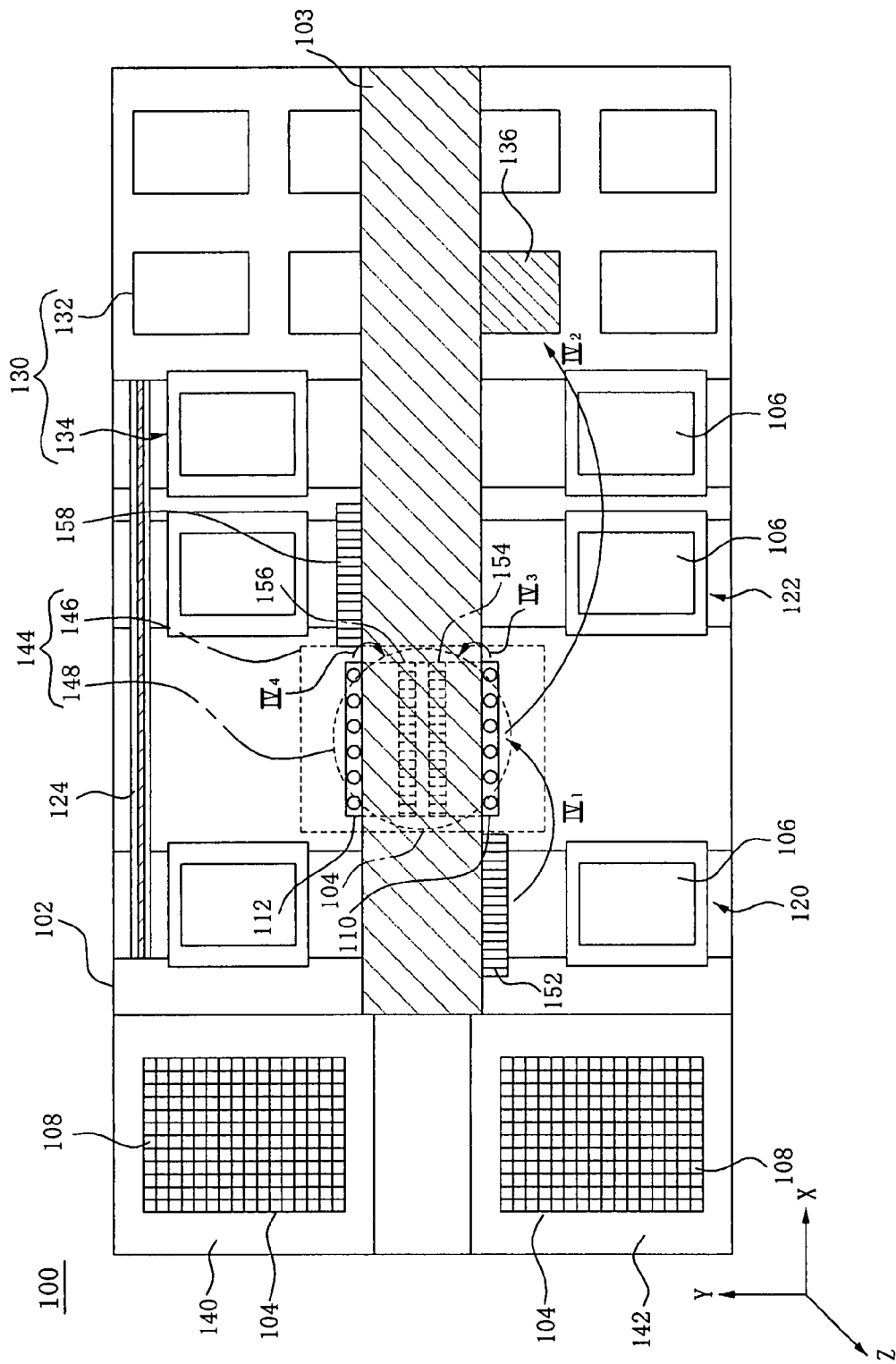
FIG. 4 is a plane view illustrating a schematic configuration of the apparatus for sorting burn-in tested packaged chips according to the present invention, which is necessary to describe steps of moving a DC test unit to perform DC test.

FIG. 4 is a plane view illustrating a schematic configuration of the apparatus for sorting burn-in tested packaged chips according to the present invention, which is necessary to describe steps of moving the DC test unit to perform the DC test.

As shown in FIG. 4, the DC failure/loading header 152 is moved in the direction indicated by the arrow IV1 to pick up the DC test-failed packaged chips from the DC test unit 110. Thereafter, the DC failure/loading header 152 is moved in the direction indicated by the arrow IV2 to place the DC test-failed packaged chips on the DC failure tray 136. The DC test unit 110 is moved in the direction indicated by the arrow IV3, after the DC test-failed packaged chips are all transferred from the DC test unit 110. At the same time, the unloading buffer is moved in the direction indicated by the arrow IV4.

The DC failure/loading head 152 returns to its original position after transferring packaged chips intended for DC test to the DC test unit. Instead, the DC failure/loading head 152 may wait until the DC test unit finishes performing the DC test on the package chips after the failure/loading head 152 transfers the packaged chips to the DC test unit 110. Thereafter, the DC failure/loading head 152 may pick up DC test-failed packaged chips.

Figure 5:
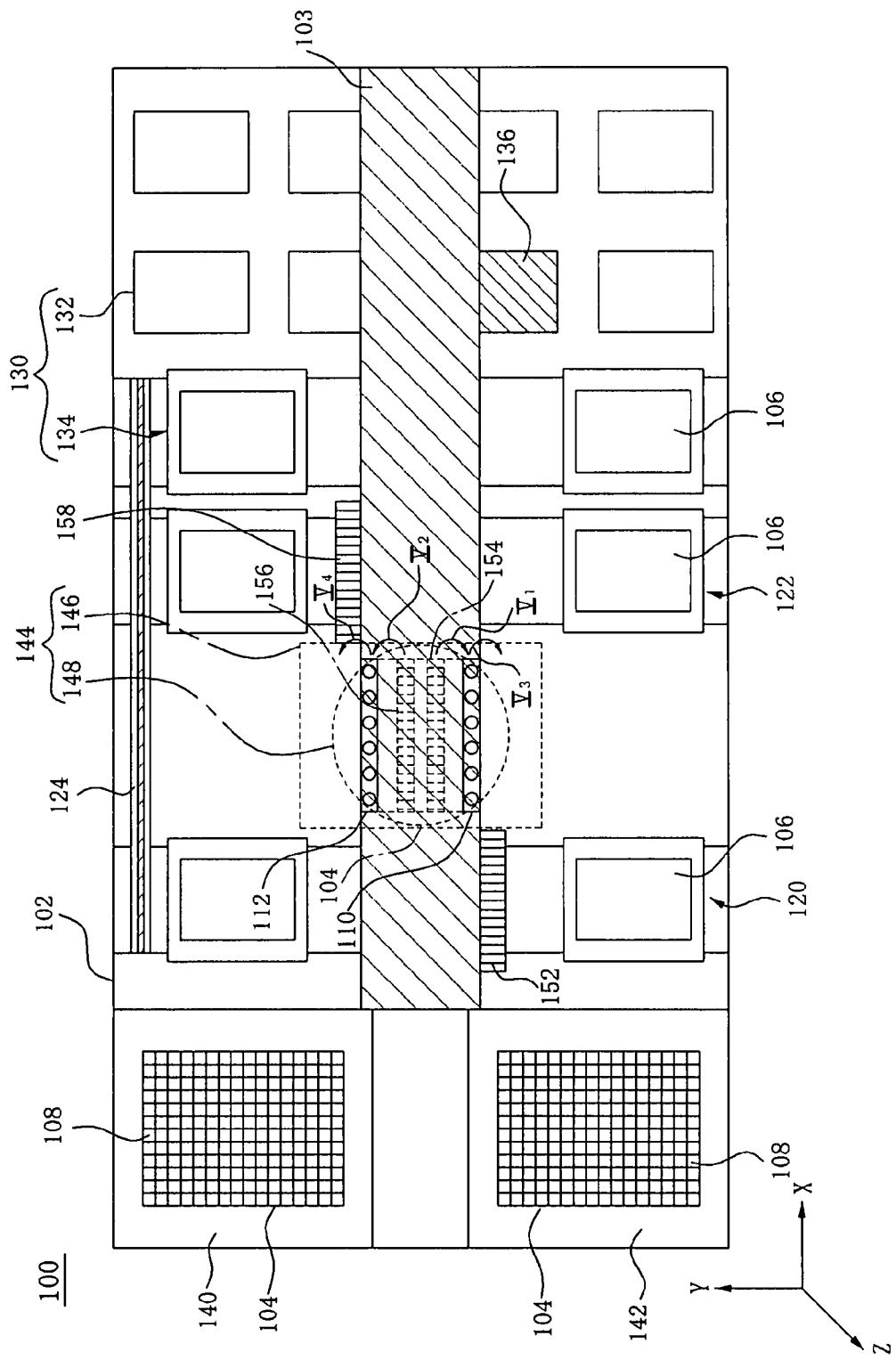
FIG. 5 is a plane view illustrating a schematic configuration of the apparatus for sorting burn-in tested packaged chips according to the present invention, which is necessary to describe steps of replacing packaged chips in the burn-in board with new ones.

FIG. 5 is a plane view illustrating a schematic configuration of the apparatus for sorting packaged chips according to the present invention, which is necessary to describe steps of replacing packaged chips in the burn-in board with new ones.

The removing head 156 is moved in the direction indicated by the arrow V1, along with the inserting head 154. The removing head 156 picks up the burn-in tested packaged chips from the burn-in board 104.

The inserting head 154 and the removing head 156, after picking up DC tested packaged chips and burn-in tested packaged chips, respectively, are moved in the opposite direction of the arrow V1. The inserting head 154 inserts the packaged chips transferred from the DC test unit 110 into the sockets of the burn-in board 104 which are empty because the removing head 156 picks up all the packaged chips.

Thereafter, the removing head 156 is moved in the direction indicated by the arrow V2, along with the inserting head 154. The removing head 156 places the burn-in tested packaged chips, which is picked up from the burn-in board 104, on the unloading buffer 112.

The DC test unit 110 and the unloading buffer 112, after the burn-in tested packaged chips on the unloading buffer 112 are all transferred, are moved in the directions indicated by the arrows V3 and V4, respectively, to return to their respective original positions.

The inserting head 154 and the removing head 156 are formed as one body. Thus, the distance between the inserting head 154 and the removing head 1 is constant. Therefore, the burn-in board 104 has to be moved in a straight line or rotated, to insert the packaged chips intended for burn-in test, which are inserted by the inserting head 154, into the sockets of the burn-in board 104 from which the removing head 156 picks up the burn-in tested packaged chips.

The inserting head 154 and the removing head 156 may be separately provided to enable them to be moved independent of each other.

Figure 6:
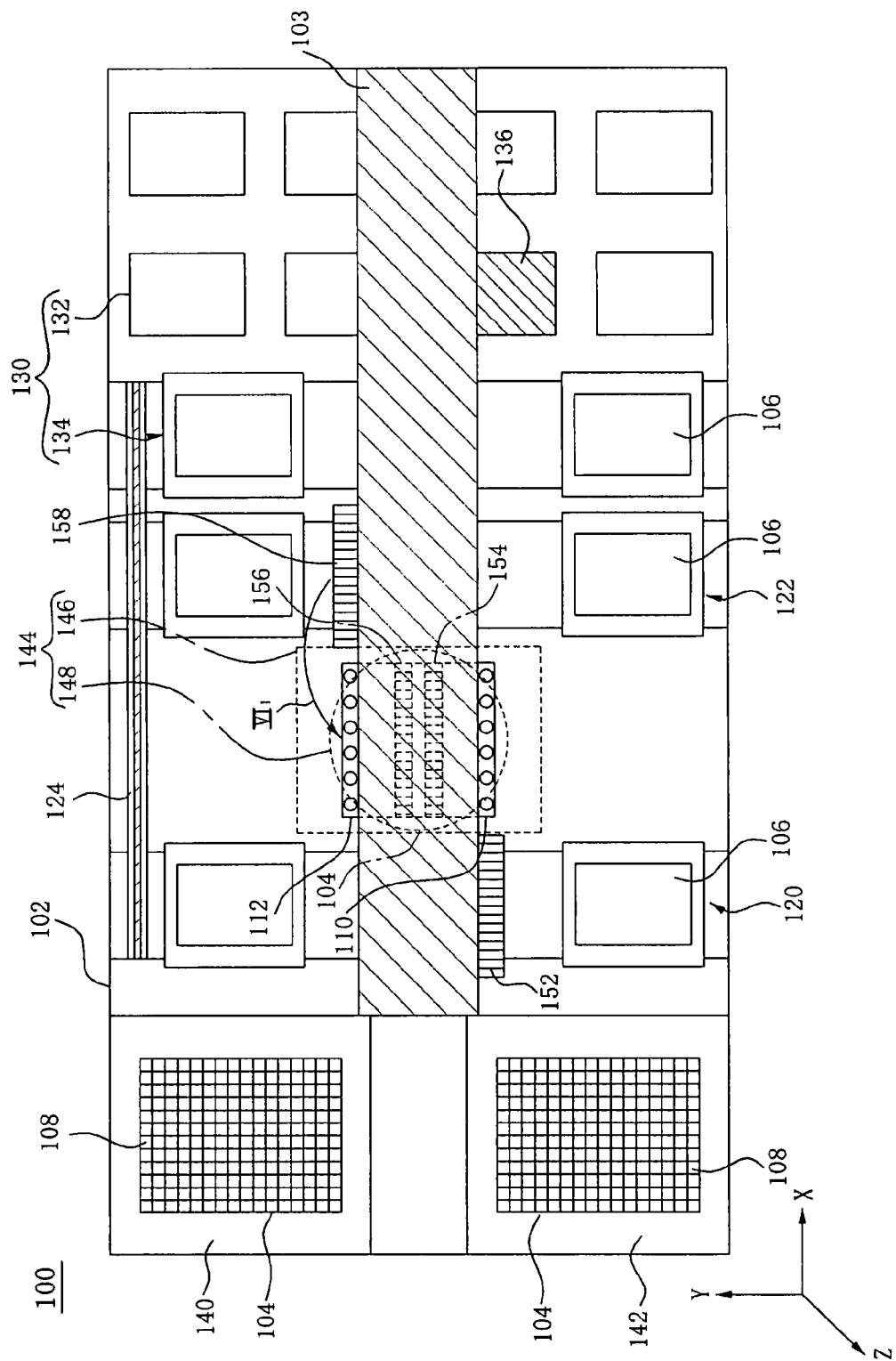
FIG. 6 a plane view illustrating a schematic configuration of the apparatus for sorting burn-in tested packaged chips according to the present invention, which is necessary to describe steps of sorting packaged chips placed on an unloading buffer.

FIG. 6 is a plane view illustrating a schematic configuration of the apparatus for sorting burn-in tested packaged chips according to the present invention, which is necessary to describe steps of sorting packaged chips placed on an unloading buffer.

As shown in FIG. 6, the burn-in tested packaged chips are placed on the unloading buffer 112. The unloading/sorting head 158 is moved in the direction indicated by the arrow VI 1 to unload/sort the burn-in tested packaged chips placed on the unloading buffer 112. The unloading/sorting head 158, after picking up the burn-in tested packaged chips from the unloading buffer 112, is moved in the opposite direction of the arrow VI1.

The unloading/sorting head 158 places in the tray 106 on the tray unloader 122 the burn-in test-passed packaged chips selected from the picked up burn-in tested packaged chips. The unloading/sorting head 158 transfers the remaining burn-in tested packaged chips, i.e., the burn-in test-failed packaged chips to the sorting unit 130. The burn-in test-failed packaged chips are placed in the sorting loader 134 or the sorting trays 132 according to their grades.

The method for sorting burn-in tested packaged chips is now described.

Figure 7:
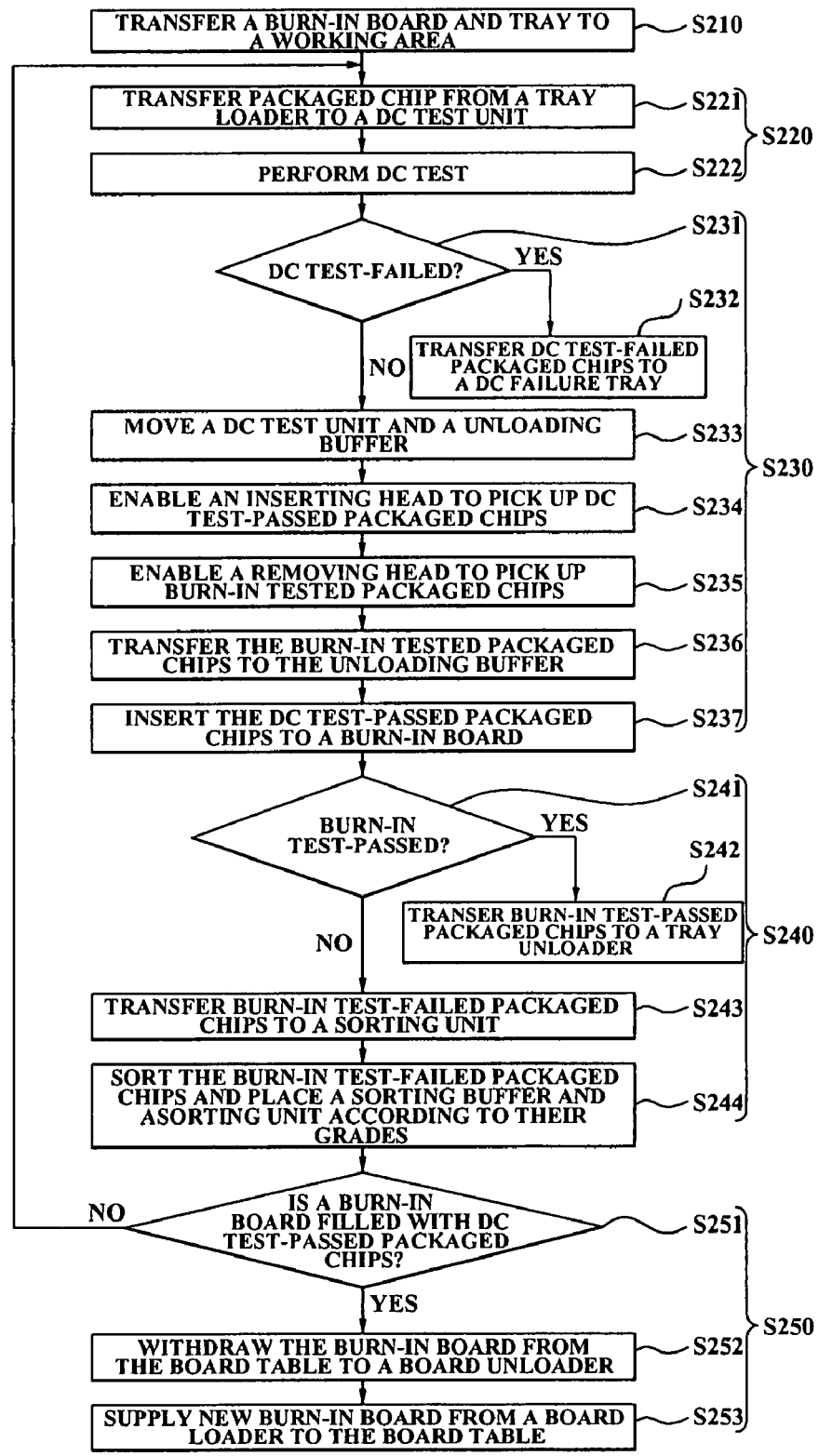
FIG. 7 is a flow chart illustrating a method for sorting burn-in tested packaged chips according to the present invention.

FIG. 7 is a flow chart illustrating the method for sorting burn-in tested packaged chips according to the present invention.

The burn-in board is mounted on the board table. The tray containing the packaged chips intended for burn-in test is provided to the tray loader, and the empty tray is provided to the tray unloader (S210).

The DC failure/loading head transfers the packaged chips intended for DC test from the tray loader to the DC test unit. The DC test unit performs the DC test on the received packaged chips (S220).

That is, the DC failure/loading head transfers the packaged chips intended for DC test, which are supplied from the tray loader, to the DC test unit (S221)

The DC test unit performs the DC test on the received packaged chips (S222).

The DC test-failed packaged chips are transferred to the DC failure tray by the DC failure/loading head. The DC test unit is moved close to the inserting head and the unloading buffer is moved close to the removing head. The DC test-passed packaged chips and the burn-in tested package chips are picked up by the inserting head and the removing head, respectively. Thereafter, the inserting head inserts the DC tested packaged chips into the burn-in board and the removing head places the burn-in tested packaged chips on the unloading buffer (S230).

The step S230 are subdivided as follows.

The DC test unit performs the DC test on the received packaged chips (S231)

The DC failure head transfers the DC test-failed packaged chips to the DC failure tray (S232)

The DC test unit is moved toward the inserting head and the unloading buffer is moved toward the removing head (S233)

The inserting head picks up the DC test-passed packaged chips from the DC test unit (S234).

The inserting head picks up the DC tested packaged chips, and the removing head picks up the burn-in tested packaged chips from the burn-in board (S235).

The removing head transfers the burn-in tested packaged chips from the burn-in board to the unloading buffer (S236)

The inserting head inserts the DC tested packaged chips into the empty sockets of the burn-in board (S237).

The burn-in test-passed packaged chips are selected from the burn-in tested packaged chips transferred to the unloading buffer and are transferred to the tray unloader, and the burn-in test-failed packaged chips are transferred to the sorting unit (S240).

The step S240 is subdivided as follows.

It is checked if the packaged chips transferred to the unloading buffer passes or fails the burn-in test (S241)

The unloading/sorting head transfers the burn-in test-passed packaged chips to the tray unloader (S242).

The unloading/sorting head transfers the burn-in test-failed packaged chips to the sorting unit (S243).

The tray transferring unit sorts the burn-in test-failed packaged chips on a basis of grade and places them in the sorting loader to which the tray is supplied, or in the sorting trays according to their grades (S244).

When one row of sockets is filled with packaged chips intended for burn-in test, the burn-in board is moved by one step to fill the next row of sockets with packaged chips intended for burn-in test (S250).

The step 250 is subdivided as follows.

It is checked if the burn-in board is filled with DC test-passed packaged chips, while burn-in tested packaged chips are transferred to the tray unloader and the sorting unit (S251).

When all rows of sockets on the burn-in board are used, the burn-in board is withdrawn from the board table to the board unloader (S252).

The burn-in board withdrawn to the board unloader is transferred to an outside working area, and a burn-in board containing burn-in tested packaged chips is supplied to the board table from the board loader 140 (S253).

The structure in which the DC test unit is movable toward the DC failure/loading head and the inserting head makes it possible to reduce the distance which the heads have to travel and to prevent the DC failure/loading head and the inserting head from interfering with each other.

The timely moving of the DC test unit toward the DC failure/loading head transferring the packaged chips intended for DC test, or the DC test-failed packaged chips, reduces the time for preparing for DC test and for sorting burn-in tested packaged chips.

Furthermore, the timely moving of the DC test unit toward the inserting head transferring the DC test-passed packaged chips, reduces the time for picking up the DC test-passed packaged chips. The reduction of the traveling distance of the inserting head makes it possible to reduce a size of the second frame moving the inserting head.

The structure in which the unloading buffer is movable toward the removing head makes it possible to reduce the distance which the head has to travel and to prevent the removing head and the sorting/unloading head from interfering with each other.

The timely moving of the unloading buffer, instead of the removing head transferring the burn-in tested packaged chips, reduces the time for sorting burn-in tested packaged chips according to their grades. Also, the reduction of the traveling distance of the unloading buffer makes it possible to reduce the size of the second frame moving the removing head.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. An apparatus for sorting burn-in tested packaged chips, the apparatus comprising:
   a DC test device that performs a DC test on packaged chips;
   a DC failure/loading head that moves in a first direction to load packaged chips onto the DC test device; and
   an inserting head that moves in a second direction perpendicular to the first direction to transfer DC test-passed packaged chips from the DC test device to a burn-in board, wherein the DC test device is moved in the second direction, close to the DC failure/loading head when loading the packaged chips onto the DC test device and close to the inserting head when transferring the DC test-passed packaged chips to the burn-in board.

2. The apparatus according to claim 1, further comprising:
   a tray loader that supplies packaged chips to the DC test device;
   a tray unloader, provided opposite to the tray loader, that receives burn-in test-passed packaged chips from the burn-in board; and
   a sorting device that receives burn-in test-failed packaged chips from the burn-in board, wherein the DC failure/loading head is moved between the tray loader and the DC test unit or the sorting device.

3. The apparatus, according to claim 2, further comprising an unloading buffer, provided opposite to the DC test device, that receives the burn-in tested packaged chips from the burn-in board.

4. The apparatus, according to claim 3, further comprising:
   a removing head that moves in the second direction to transfer the burn-in tested packaged chips from the burn-in board to the unloading buffer; and
   an unloading/sorting head that moves in the first direction to sort the burn-in tested packaged chips transferred from the unloading buffer on a basis of grade and transfer the sorted packaged chips to the tray unloader or the sorting device according to their grades, wherein the unloading buffer is moved close to the removing head at the time of unloading, and close to the unloading/sorting head at the time of grading.

5. The apparatus according to claim 4, wherein a plurality of pickers are arranged in a row on the DC failure/loading head and the unloading/sorting head in the first direction, and a plurality of pickers are arranged in a row on the inserting head and the removing head in a direction perpendicular to the first direction.

6. The apparatus according to claim 4, wherein the inserting head and the removing head are formed as one body.

7. The apparatus according to claim 6, wherein the inserting head and the removing head, provided opposite to each other, are moved in the second direction between two frames arranged in one pair in the second direction.

8. The apparatus according to claim 1, wherein the DC failure/loading head is moved in the first direction to transfer DC test-failed packaged chips.

9. The apparatus according to claim 1, wherein DC test-failed packaged chips are transferred by the DC failure/loading head from the DC test device to a tray intended to contain DC test-failed packaged chips.

10. A method for sorting burn-in tested packaged chips, the method comprising:
    mounting a burn-in board on a board table and providing a tray containing packaged chips intended for burn-in testing to a tray loader and an empty tray to a tray unloader, respectively;
    enabling a DC failure/loading header, including a plurality of pickers arranged in a row in a direction in which the DC failure/loading header is moved backwards and forwards, to transfer packaged chips intended for DC test from the tray loader to a DC test device, and performing the DC test on the transferred packaged chips;
    transferring DC test-failed packaged chips to a specific tray using the DC failure/loading head;
    (d) moving the DC test device close to an inserting head and an unloading buffer close to a removing head;
    (e) enabling the removing head, including a plurality of pickers arranged in a row in a direction perpendicular to a direction in which the removing head is moved backwards and forwards, to pick up and insert burn-in tested packaged chips from the burn-in board and into the unloading buffer, and enabling the inserting head, including a plurality of pickers arranged in a row in a direction perpendicular to a direction in which the inserting head is moved backwards and forwards, to pick up DC test-passed packaged chips from the DC test device and insert the DC test-passed packaged chips into the burn-in board;
    enabling an unloading/sorting head, on which a plurality of pickers are arranged in a row in a direction in which the unloading/sorting head is moved, to transfer burn-in test-passed packaged chips, selected from burn-in tested packaged chips transferred on the unloading buffer, to the tray unloader and transfer burn-in test-failed packaged chips to a sorting device; and
    replacing the burn-in board with another burn-in board.

11. The method according to claim 10, wherein the enabling the removing head comprises enabling the inserting head to insert the DC test-passed packaged chips into a position from which the removing head picks up the burn-in tested packaged chips.

* * * * *